United States Patent
Fricke et al.

(10) Patent No.: US 10,498,105 B2
(45) Date of Patent: Dec. 3, 2019

(54) LASER DIODE WITH IMPROVED ELECTRICAL CONDUCTION PROPERTIES

(71) Applicant: FORSCHUNGSVERBUND BERLIN E.V., Berlin (DE)

(72) Inventors: Joerg Fricke, Berlin (DE); Jonathan Decker, Berlin (DE); Paul Crump, Berlin (DE); Goetz Erbert, Berlin (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 0 days.

(21) Appl. No.: 15/551,758

(22) PCT Filed: Feb. 18, 2016

(86) PCT No.: PCT/EP2016/053442
§ 371 (c)(1),
(2) Date: Aug. 17, 2017

(87) PCT Pub. No.: WO2016/131910
PCT Pub. Date: Aug. 25, 2016

(65) Prior Publication Data
US 2018/0019571 A1    Jan. 18, 2018

(30) Foreign Application Priority Data
Feb. 20, 2015    (DE) .......... 10 2015 203 113

(51) Int. Cl.
*H01S 5/00*    (2006.01)
*H01S 5/10*    (2006.01)
(Continued)

(52) U.S. Cl.
CPC .......... *H01S 5/1064* (2013.01); *H01S 5/0421* (2013.01); *H01S 5/12* (2013.01);
(Continued)

(58) Field of Classification Search
CPC . H01S 5/1064; H01S 5/12; H01S 5/22; H01S 5/0421; H01S 5/2036; H01S 5/50;
(Continued)

(56) References Cited

U.S. PATENT DOCUMENTS 5,392,308 A    2/1995 Welch et al.
5,539,571 A *  7/1996 Welch ............... H01S 5/026
                                                 359/344
(Continued)

FOREIGN PATENT DOCUMENTS

DE    102008014093    7/2009
WO    9966614        12/1999

OTHER PUBLICATIONS

International Search Report mailed in PCT/EP2016/053442 dated May 31, 2016.
(Continued)

*Primary Examiner* — Tod T Van Roy
*Assistant Examiner* — Delma R. Fordé
(74) *Attorney, Agent, or Firm* — Fox Rothschild LLP

(57) ABSTRACT

The invention relates to a laser diode (10) which has at least one active layer (12) which is arranged within a resonator (14) and is operatively connected to a outcoupling element (16), and further at least one contact layer (18) for coupling charge carriers into the active layer (12), wherein the resonator (14) comprises at least a first section (20) and a second section (22), wherein the second section (22) comprises a plurality of separate resistor elements (24) having a specific electrical resistivity greater than the specific electrical resistivity of the regions (26) between adjacent resistor elements (24), wherein a width (W3) of the resistor elements (24) along a longitudinal axis (X1) of the active layer (12) is less than 20 μm, and a projection of the resistor elements (24) on
(Continued)

the active layer (12) along the first axis (Z1) overlap with at least 10% of the active layer (12).

19 Claims, 9 Drawing Sheets

(51) Int. Cl.
*H01S 5/042* (2006.01)
*H01S 5/20* (2006.01)
*H01S 5/22* (2006.01)
*H01S 5/12* (2006.01)
*H01S 5/022* (2006.01)
*H01S 5/50* (2006.01)

(52) U.S. Cl.
CPC .............. *H01S 5/2036* (2013.01); *H01S 5/22* (2013.01); *H01S 5/0224* (2013.01); *H01S 5/0425* (2013.01); *H01S 5/1203* (2013.01); *H01S 5/50* (2013.01)

(58) Field of Classification Search
CPC ........ H01S 5/20; H01S 5/2018; H01S 5/2031; H01S 5/222; H01S 5/2222; H01S 5/2223; H01S 5/2224; H01S 5/2226; H01S 5/2227; H01S 5/2228; H01S 5/223; H01S 5/2234; H01S 5/2238; H01S 5/2237; H01S 5/227; H01S 5/2272; H01S 5/2275; H01S 5/2277; H01S 5/2235; H01S 5/1003; H01S 5/08; H01S 5/2231; H01S 5/2232
See application file for complete search history.

(56) References Cited

U.S. PATENT DOCUMENTS

| | | | |
|---|---|---|---|
| 5,793,521 A | 8/1998 | O'Brien et al. | |
| 6,014,396 A | 1/2000 | Osinski et al. | |
| 6,148,013 A | 11/2000 | Geels et al. | |
| 2003/0112842 A1* | 6/2003 | Crawford | H01S 5/22 372/46.01 |
| 2007/0165685 A1* | 7/2007 | Mizuuchi | H01S 5/0625 372/38.05 |
| 2010/0284434 A1* | 11/2010 | Koenig | H01S 5/0425 372/46.01 |
| 2011/0317733 A1* | 12/2011 | Tani | B82Y 20/00 372/46.012 |
| 2012/0147917 A1* | 6/2012 | Oki | B82Y 20/00 372/45.013 |
| 2013/0089115 A1* | 4/2013 | Kanskar | H01S 5/1014 372/45.01 |
| 2015/0063392 A1* | 3/2015 | Takayama | H01S 5/2205 372/45.01 |

OTHER PUBLICATIONS

Feng et al.: "Reduction of the frequency chirp of two section distributed feedback laser by nonuniform current injection", Applied Physics Letters, Jan. 30, 1995.
Sumpf et al.: "High brightness 735 nm tapered lasers—optimisation of the laser geometry", Optical and Quantum Electronics 35: 521-532, 2003.
Paschke et al.: "Nearly Diffraction Limited 980-nm Tapered Diode Lasers With an Output Power of 7.7 W", IEEE Journal of Selected Topics in Quantum Electronics, vol. 11, No. 5, Sep./Oct. 2005.
Fiebig et al.: "High-Power DBR-Tapered Laser at 980 nm for Single-Path Second Harmonic Generation", IEEE Journal of Selected Topics in Quantum Electronics, vol. 15, No. 3, May/Jun. 2009.
Wenzel et al: "Theoretical and experimental investigations of the limits to the maximum output power of laser diodes", New Journal of Physics 12 (2010) 085007 (11pp).
Crump et al.: "Experimental and theoretical analysis of the dominant lateral wave guiding mechanism in 975 nm high power broad area diode lasers", Semicond. Sci. Technol. 27 (2012) 045001 (9pp).
O'Neill et al.: "Modification of internal temperature distribution in broad area semiconductor lasers and the effect on near- and far-field distributions", IEE Pmc.-Optoelectron., vol. 147, No. I , Feb. 2000.

\* cited by examiner

LASER DIODE WITH IMPROVED ELECTRICAL CONDUCTION PROPERTIES

CROSS REFERENCE TO RELATED APPLICATIONS

This U.S. Application is a National Stage Entry of PCT/EP2016/053442 filed on Feb. 18, 2016, which claims priority to German Application No.: 10 2015 203 113.6 filed Feb. 20, 2015, entitled "LASER DIODE WITH IMPROVED ELECTRICAL CONDUCTIVITY CHARACTERISTICS" the entireties of which are hereby incorporated herein by reference.

The invention relates to a laser diode having improved electrical conducting properties and a corresponding diode laser.

INTRODUCTION

For high-performance applications, diode lasers are soldered on a heat-conductive carrier. Therefore, the epitaxial layers, normally the p-doped side, are soldered directly onto the support for optimal cooling. In this configuration, the entire p-side is electrically contacted and is thus operated with a common voltage. In many areas, for example in material processing, larger systems with higher performance are required. For this purpose, the diode lasers are arranged in larger planar regions (arrays) to form so-called laser bars. All laser bars are controlled jointly.

STATE OF THE ART

In order to be able to realize improved electrooptical properties, for example an improved beam quality, individual sections of the laser diode are frequently controlled separately. Such a know component is, for example, a trapezoidal laser diode.

FIG. 1 shows a schematic representation of a conventional trapezoidal laser diode 56. On a substrate 58, an n-type cladding layer 62, an n-type waveguide layer 64, a layer with an active zone 66 as well as a p-waveguide layer 68 and a p-type cladding layer 70 are applied. Furthermore, the trapezoidal laser diode 56 has a p-doped contact region 72 and an n-doped contact region 74, wherein the p-doped contact region 72 consisting of a rib waveguide region 76 and a trapezoid region 78. The trapezoidal laser diode 56 is delimited by a front facet 80 and a back facet 82.

For example, as described by C. Fiebig et al. IEEE JSTQE 15 (3) pp. 978-983 (2009), K. Paschke et al. IEEE JSTQE 11 (5) pp. 1223-1226 (2005) and B. Sumpf et al. Opt. Quant. Electron. 35, pp. 21-532 (2003), the beam quality and the achievable maximum performance, respectively the conversion efficiency, depend on the ratio of the inserted currents into the rib waveguide region 76 and the trapezoid region 78 as well as on the geometries of these regions.

The ratio of the currents respectively inserted into the rib waveguide region 76 and into the trapezoidal region 78 is set on individually designed trapezoidal lasers via a separate control of the rib waveguide region and of the trapezoidal region. However, this leads to disadvantages in the production costs as well as in terms of cooling and performance scaling in larger systems. When rib waveguide 76 and trapezoid region 78 are short-circuited to enable a common control, however, this results in deteriorated characteristics such as reduced performance, lower efficiency, and deteriorated beam quality. Known measures for counteracting this consist of, inter alia, a reduction in the trapezoid region while at the same time extending the rib waveguide region. However, these measures have not yet been able to compensate the disadvantages.

A conventional broad-stripe laser diode 84 is shown in FIG. 2. On the basis of the similar design, reference is made to the same reference symbols, as in the case of the trapezoidal laser diode 56 of FIG. 1. The broad-stripe laser diode 84 also has a front facet 80 and a back facet 82. An n-type cladding layer 62, an n-type waveguide layer 64, a layer with an active region 66, a p-waveguide layer 68 and a p-type cladding layer 70 are applied to a substrate 58. Further, the broad-stripe laser diode 84 has a p-doped contact region 72 and an n-doped contact region 74.

As, for example, known from H. Wenzel et al. N J Physics 12, p 085007 (2010), the occurrence of hole burning effects proves to be disadvantageous in connection with broad-stripe laser diodes. This refers to the formation of spatial zones of the laser diode, which contribute less to the laser process, for example a local reduction of the gain due to spatial hole burning or a reduced amplification of desired frequencies (spectral hole burning).

The problem of longitudinal hole burning is solved, for example, in Feng, Appl. Phys. Lett., 66, 2028 by separate contacting, which is, however, complex and thus expensive. Another disadvantageous aspect is the formation of thermal lenses. An inhomogeneous temperature distribution in the optical medium influences, for example caused by the electric current flow and the resulting local self heating, which generates the additional waveguide and a consequent undesirable increase of the divergence angle (P. Crump et al., Semicond., Sci. Technol., 27, 045001 (2012)).

The problem of the thermal lens has been solved, for example, in E. O'Neill, Proc IEE 147, p. 31 (2000) by external heating elements (external laser radiation), which however is complex and thus expensive.

It is therefore an object of the present invention to provide a trapezoidal laser diode with an improved design which, when the different regions are controlled jointly, does not have the disadvantages associated therewith so far. Another object of the present invention is to provide a broad-stripe laser diode having an improved design in which the occurrence of hole burning effects and the formation of thermal lenses are avoided. Further, an object is to provide a broad-stripe laser diode with an improved design having a more stable emission spectrum.

DISCLOSURE OF THE INVENTION

These objects are achieved by the features of the independent patent claims 1 and 11. Further advantageous embodiments of the present invention result from the features mentioned in the subclaims.

According to a first aspect of the present invention, a laser diode is disclosed comprising: at least one active layer disposed within a resonator and operatively connected to an outcoupling element, and comprises at least one contact layer for coupling charge carriers into the active layer, wherein the resonator comprises at least a first section and a second section, wherein the maximum width of the active layer in the first section differs from the maximum width of the active layer in the second section, and a projection of the contact layer along a first axis extending perpendicular to the active layer, overlaps with the first section as well as with the second section. According to the invention, the second section has a plurality of separate resistor elements whose specific electrical resistivity is greater than the specific electrical resistivity of the regions between adjacent resistor elements and a width of the resistor elements along a longitudinal axis of the active layer is less than 20 µm, and a projection of the resistor elements on the active layer along the first axis overlaps with at least 10% of the active layer.

The advantage of the present invention is that the overall electrical resistance in the second section is increased to such an extent that a greater proportion of the current flows through the first section. Through dimensioning on a case-by-case interpretation, an optimal ratio between the current portion in the first section and the current portion in the second section can be set. In spite of a common contact between the first and second section, an optimal current distribution is thus set.

Preferably, the first section does not have any resistor elements.

Preferably, the second section is designed in such a way that the current density within the second section (also referred to as an amplifier section) is longitudinally uniform over a respective resistor element and a respective region between two resistor elements. This means that a maximum current density and a minimum current density over a respective resistor element and a respective region between two resistor elements during operation differs by preferably less than 20%, more preferably less than 10%, even more preferably less than 5%, even more preferably less than 2%, and even more preferably less than 1%. In the same way, it is preferred that the second section is designed in such a way that the specific electrical resistivity within the second section is longitudinally uniform over one respective resistor element and one respective region between two resistor elements. This preferably means that a maximum of the specific electrical resistivity differs from a minimum of the specific electrical resistivity in the longitudinal direction (i.e. along the longitudinal axis (axis X1 in FIG. 3)) over a respective resistor element and a respective region between two resistor elements by less than 20%, more preferably less than 10%, even more preferably less than 5%, even more preferably less than 2%, and even more preferably less than 1%. As a result, the current density can advantageously be increased only in the first section (also referred to as single mode section).

Preferably, the length of the second section is greater than 50%, more preferably greater than 60% of the total length (=sum of length of the first section and length of the second section) to achieve sufficient reinforcement. Preferably, the device has only one trapezoid-shaped amplifier section.

Preferably, the ratio (quotient) of the width of the trapezoid-shaped second section in the region of the (exit) facet (maximum width region) to the width of the first section in the region of the (opposite) facet (maximum width) is greater than 10, more preferably greater than 25, even more preferably greater than 30, even more preferably greater than 50, even more preferably greater than 75, and even more preferably greater than 100. This allows achieving a particularly high amplification.

Preferably, the device comprises semi-conducting waveguide layers and semi-conducting cladding layers. Preferably, the waveguide layers have aluminum gallium arsenide ($Al_xGa_{(1-x)}As$ with $0 \leq x \leq 1$). Preferably, the cladding layers comprise aluminum gallium arsenide.

Preferably, the resistor elements (longitudinally) extend almost over the entire region of the second section, i.e. preferably at least 80%, more preferably at least 90%, and even more preferably at least 95% of the second section.

The setting of the relevant design parameters is particularly important in a preferred embodiment of the present invention. Thus, the percentage overlap proportion of the projection of the resistor elements on the active layer along the first axis with the active layer is preferably sufficiently large to influence the current distribution in an advantageous manner. The resistor elements must also be narrow enough to minimize optical losses or charge carrier losses.

Advantageously, the projection of the resistor elements on the active layer along the first axis, perpendicular to the active layer, can cover at least 20%, preferably at least 30%, further more preferably at least 40% and particularly preferably at least 50% of the total projected surface of the active layer along the same axis, but preferably not more than 95%, and particularly preferably not more than 99%. It is furthermore preferred that the maximum extent of the respective resistor elements along the longitudinal axis of the active layer is not more than 15 µm, more preferably not more than 11 µm, and particularly preferably not more than 6 µm, but preferably not less than 1 µm because it has been found that such a setting of the design parameters leads to improved performance and efficiency.

The resistor elements preferably have a specific electrical resistivity which is significantly greater than the specific electrical resistivity (hereinafter referred to as $\Box\sigma_c$, for example $\Box\sigma_c=1.0\times10^{-3}$ $\Omega\cdot m$) of the epitaxial layer structure used. Preferably, the specific electrical resistivity of the resistor elements is more than $2 \Box\sigma_c$ (for example $2.0\times10^{-3}$ $\Omega\cdot m$), further preferably more than $10\sigma_c$ (for example $1.0\times10^{-2}$ $\Omega\cdot m$), further preferably more than $10^2\sigma_c$ (for example $1.0\times10^{-1}$ $\Omega$–m), further preferably more than $10^3\sigma_c$ (for example $1.0\times\Omega\cdot m$), further preferably more than $10^4\sigma_c$ (for example $1.0\times10^1$ $\Omega\cdot m$), further preferably more than $10^5\sigma_c$ (for example $1.0\times10^2$ $\Omega\cdot m$), further preferably more than $10^6\sigma_c$ (for example $1.0\times10^3$ $\Omega\cdot m$), further preferably more than $10^7\sigma_c$ (for example $1.0\times10^4$ $\Omega\cdot m$), further preferably more than $10^8\sigma_c$ (for example $1.0\times10^5$ $\Omega\cdot m$), and particularly preferably more than $10^9\sigma_c$ (for example $1.0\times10^6$ $\Omega\cdot m$).

In a further preferred embodiment, the first section is designed as a rib waveguide region and the second section is designed as a trapezoidal region. This offers the advantage that the properties of known trapezoidal lasers can be used with regard to a higher performance and improved beam quality, wherein the decentralized control of such trapezoidal lasers so far required for this purpose is no longer necessary. In other words, both the rib waveguide region (first section) and the trapezoidal region (second section) have a common contact layer (s) for coupling in or outcoupling charge carriers. Preferably, the trapezoidal region is designed triangular and axially symmetrical relative to a longitudinal axis of the active layer.

In a further advantageous embodiment of the present invention, it is provided that the resistor elements have at least two plane-parallel surfaces whose normal vectors are oriented parallel to the longitudinal axis of the active layer. This offers the advantage that lateral local filamentation is reduced. Particularly preferred are the (preferably strip-shaped) resistor elements having a uniform layer thickness (over their longitudinal extent).

In a particularly preferred embodiment, filamentation is advantageously avoided in that the resistor elements each have at least two plane-parallel surfaces which extend over the entire length of the respective resistor element and whose normal vectors are oriented parallel to the longitudinal axis of the active layer. In other words: The resistor elements have a constant width at each location in this preferred embodiment and, in addition, all the resistor elements are oriented parallel to one another. This also offers the advantage that optical losses and charge carrier losses are minimized.

In a further preferred embodiment, the resistor elements are arranged equidistantly to one another, i.e. the resistor elements are arranged periodically along the longitudinal axis of the active layer. This advantageously contributes to keeping the electrical and thermal properties of the second section constant along the longitudinal axis of the active layer (i.e., longitudinally) over a respective resistor element and a respective region between two resistor elements on average and to improving performance as well as beam quality.

In a further preferred embodiment, a ratio of the specific resistances of the resistor elements relative to the specific resistance of the regions between adjacent resistor elements is greater than 2, further preferably greater than 10, further preferably greater than $10^2$, further preferably greater than $10^3$, further preferably greater than $10^4$, further preferably greater than $10^5$, further preferably greater than $10^6$, further preferably greater than $10^7$, further preferably greater than $10^8$, and particularly preferably greater than $10^9$.

Furthermore, a laser is the object of the present invention, which comprises at least one previously described laser diode according to the invention. By integrating several laser diodes, the overall performance of the system can be advantageously increased, for example for material processing. In a preferred embodiment, a plurality of laser diodes according to the invention can be combined with one another in order to advantageously increase the performance of the overall system. A parallel connection of a plurality of laser diodes to so-called arrays is particularly preferred. This offers the advantage that the contact layers of the individual laser diodes or of the laser diodes in a bolt unit (so-called laser bar) can be arranged on a common circuit board or can be controlled jointly. Furthermore preferred is a series connection of a plurality of laser diodes or laser bars to so-called stacks. This gives on the one hand the advantage that the installation space is reduced in terms of the horizontal surface requirement and, on the other hand, a common control of the laser diodes can be achieved by contacting a respective contact layer of the lowest and the laser diode of the bolt unit advantageously for a maximum performance density and minimum production costs.

According to a further aspect of the invention, a laser diode is disclosed comprising at least an active layer disposed within a resonator and operatively connected to a first facet and a second facet, wherein the second facet is designed as a outcoupling element and comprises at least one contact layer for coupling in charge carriers into the active layer and comprises a plurality of separate resistor elements arranged between the first facet and the second facet, wherein the specific electrical resistivity of the resistor elements is greater than the specific electrical resistivity of regions between adjacent resistor elements. According to the invention it is provided, that a maximum expansion of the respective resistor elements along a longitudinal axis of the active layer is less than 20 μm and a total surface of the resistor elements in a half of the resonator facing the first facet is greater than or equal to the total surface of the resistor elements in a half of the resonator facing the second facet.

This offers the advantage that, in the case of simple electrical contacting of the contact layer for supplying the entire laser diode with electrical energy, the current distribution within the laser diode is selectively adjustable.

In a preferred embodiment, the laser diode has two contact layers for coupling charge carriers into/out of the active layer(s).

The resistor elements preferably have a specific electrical resistivity which is significantly greater than the specific electrical resistivity (hereinafter referred to as $\square\sigma_c$, for example $||\sigma_C=1.0\times10^{-3}$ Ω·m) of the epitaxial layer structure used. The specific electrical resistivity of the resistor elements is preferably more than $2\sigma_c$ (for example $2.0\times10^{-3}$ Ω·m), further preferably more than $10\sigma_c$ (for example $1.0\times10^{-2}$ Ω·m), further preferably more than $10^2\sigma_c$ (for example $1.0\times10^{-1}$ Ω·m), further preferably more than $10^3\sigma_c$ (for example 1.0 Ω·m), further preferably more than $10^4\sigma_c$ (for example $1.0\times10^1$ Ω·m), further preferably more than $10^5\sigma_c$ (for example $1.0\times10^2$ Ω·m), further preferably more than $10^6\sigma_c$ (for example $1.0\times10^3$ Ω·m), further preferably more than $10^7\sigma_c$ (for example $1.0\times10^4$ Ω·m), further preferably more than $10^8\sigma_c$ (for example $1.0\times10^5$ Ω·m) and particularly preferably more than $10^9\sigma_c$ (for example $1.0\times10^6$ Ω·m).

The facets, as elements limiting the resonator, preferably have planar surfaces. The halves of the resonator are defined by a parting plane which is oriented parallel to the, preferably planar, facets or, in other words, is intersected normally by the longitudinal axis of the active layer and which is located halfway from the plane of the first facet to the plane of the second facet of the resonator along the longitudinal axis of the active layer.

Further advantageous embodiments of the present invention result from the features mentioned in the subclaims.

In a preferred embodiment, the total surface of the resistor elements in the half of the resonator facing the second facet is 90%, or 0.9 times, of the total surface of the resistor elements in the half of the resonator facing the first facet. In a further preferred embodiment, the total surface of the resistor elements in the half of the resonator facing the second facet is 80% (or 0.8 times), further preferably 70%, particularly preferably 66%, further preferably 60%, further preferably 50%, further preferably 40%, further preferably 30%, further preferably 20%, and further preferably 10%, of the total surface of the resistor elements in the half of the resonator facing the first facet. Finally, a variant represents a preferred embodiment in which the resistor elements are located only in the half of the resonator facing the first facet and thus the total surface of the resistor elements in the half of the resonator facing the second facet is 0% of the total surface of the resistor elements in the half of the resonator facing the first facet. These embodiments give the advantage that adjustable additional current can be provided in the region of the second facet, which is designed as an outcoupling facet, and thereby counteracts a hole burning effect.

In a further preferred embodiment, the resistor elements extend along a lateral axis of the active layer only over a partial region of the active layer. The active layer extends along the same axis, thus over a longer distance than the resistor elements. Preferably, the resistor elements extend axis-symmetrically or point-symmetrically to this lateral axis. Thus, regions without resistor elements are formed on the edges of the active layer. This offers the advantage that additional current can be supplied to the edges of the laser diode and thus the formation of a current-related thermal lens is counteracted.

Preferably, a ratio of the extent of the resistor elements to the total width of the active layer laterally to the longitudinal axis of the active layer is between 1 and 0.1, more preferably between 0.9 and 0.5 and particularly preferably between 0.8 and 0.6.

In a further advantageous embodiment of the present invention, it is provided, that the resistor elements have at least two plane-parallel surfaces whose normal vectors are oriented parallel to the longitudinal axis of the active layer. This offers the advantage, that filamentation is reduced. Particularly preferably, the resistor elements are strip-shaped with a uniform layer thickness (over their longitudinal extent).

In a particularly preferred embodiment, filamentation is advantageously avoided in that the resistor elements each have at least two plane-parallel surfaces which extend over the entire length of the respective resistor element and whose normal vectors are oriented parallel to the longitudinal axis of the active layer. In other words: The resistor elements have a constant width at each location in this preferred embodiment and, in addition, all the resistor elements are oriented parallel to one another. This also offers the advantage that optical losses and charge carrier losses are minimized.

In a further preferred embodiment, the resistor elements are disposed equidistantly to one another, i.e. the resistor elements, in the regions provided with resistor elements, are arranged periodically along the longitudinal axis of the active layer. This advantageously contributes to the fact that the electrical and thermal properties along the longitudinal axis of the active layer remain constant on average over a respective resistor element and a respective region between two resistor elements, and performance and beam quality are improved.

The resistor elements preferably have a specific electrical resistivity which is significantly greater than the specific electrical resistivity (hereinafter referred to as $\Box\sigma_c$, for example $\Box\sigma_C = 1.0 \times 10^{-3}$ Ω·m) of the epitaxial layer structure used. The specific electrical resistivity of the resistor elements is preferably more than $2\sigma_c$ (for example $2.0 \times 10^{-3}$ Ω·m), further preferably more than $10\sigma_c$ (for example $1.0 \times 10^{-2}$ Ω·m), further preferably more than $10^2\sigma_c$ (for example $1.0 \times 10^{-1}$ Ω·m), further preferably more than $10^3\sigma_c$ (for example 1.0 Ω·m), further preferably more than $10^4\sigma_c$ (for example $1.0 \times 10^1$ Ω·m), further preferably more than $10^5\sigma_c$ (for example $1.0 \times 10^2$ Ω·m), further preferably more than $10^6\sigma_c$ (for example $1.0 \times 10^3$ Ω·m), further preferably more than $10^7\sigma_c$ (for example $1.0 \times 10^4$ Ω·m), further preferably more than $10^8\sigma_c$ (for example $1.0 \times 10^5$ Ω·m) and particularly preferably more than $10^9\sigma_c$ (for example $1.0 \times 10^6$ Ω·m).

In a further advantageous embodiment it is provided, that the laser diode is a single-broad-stripe laser diode. This offers the advantage that the design is based on a known, flexible and thus inexpensively usable design of laser diode, while at the same time increasing or improving performance and beam quality.

In a further advantageous embodiment, it is provided that the resistor elements are periodically assigned, with a period Λ which corresponds to the Braggs laws. This offers the advantage that a wavelength stabilization takes place. The necessary period to stabilize diode lasers at a wavelength by $\lambda_0$ can be calculated with an equation:

$$\lambda_0 = \frac{2n_{\mathit{eff}} \Lambda}{N}.$$

N refers to a grid arrangement and $n_{\mathit{eff}}$ refers to the effective refractive index of an optical mode considered.

Furthermore, a laser is the object of the present invention, which comprises at least one previously described laser diode according to the invention. By integrating several laser diodes, the overall performance of the system can be advantageously increased, for example for material processing. In a preferred embodiment, a plurality of laser diodes according to the invention can be combined with one another in order to advantageously increase the performance of the overall system. Particularly preferred is a parallel connection of a plurality of laser diodes to so-called arrays, or in other words to laser bars. This offers the advantage, that the contact layers of the individual laser diodes can be arranged on a common circuit board or can be controlled jointly. Furthermore, a series connection of a plurality of laser diodes is also particularly preferred to form so-called stacks, or in other words to form a bolt unit. This offers on the one hand the advantage that the installation space is reduced in terms of the horizontal surface requirement and, on the other hand, a common control of the laser diodes can take place by contacting a respective contact layer of the lowest and the uppermost laser diode of the bolt unit.

Further forms of embodiment are obtained by advantageous combination of the features mentioned in the different aspects of the present invention, also transferred to the respective other aspects of the invention, in any order. Furthermore, an advantageous transferring to other known laser diodes and laser systems based on solid bodies is possible.

BRIEF DESCRIPTION OF THE FIGURES

The invention is explained in more detail below in two exemplary embodiments and the accompanying drawings. The figures show.

DETAILED DESCRIPTION OF THE FIGURES

Figure 1:
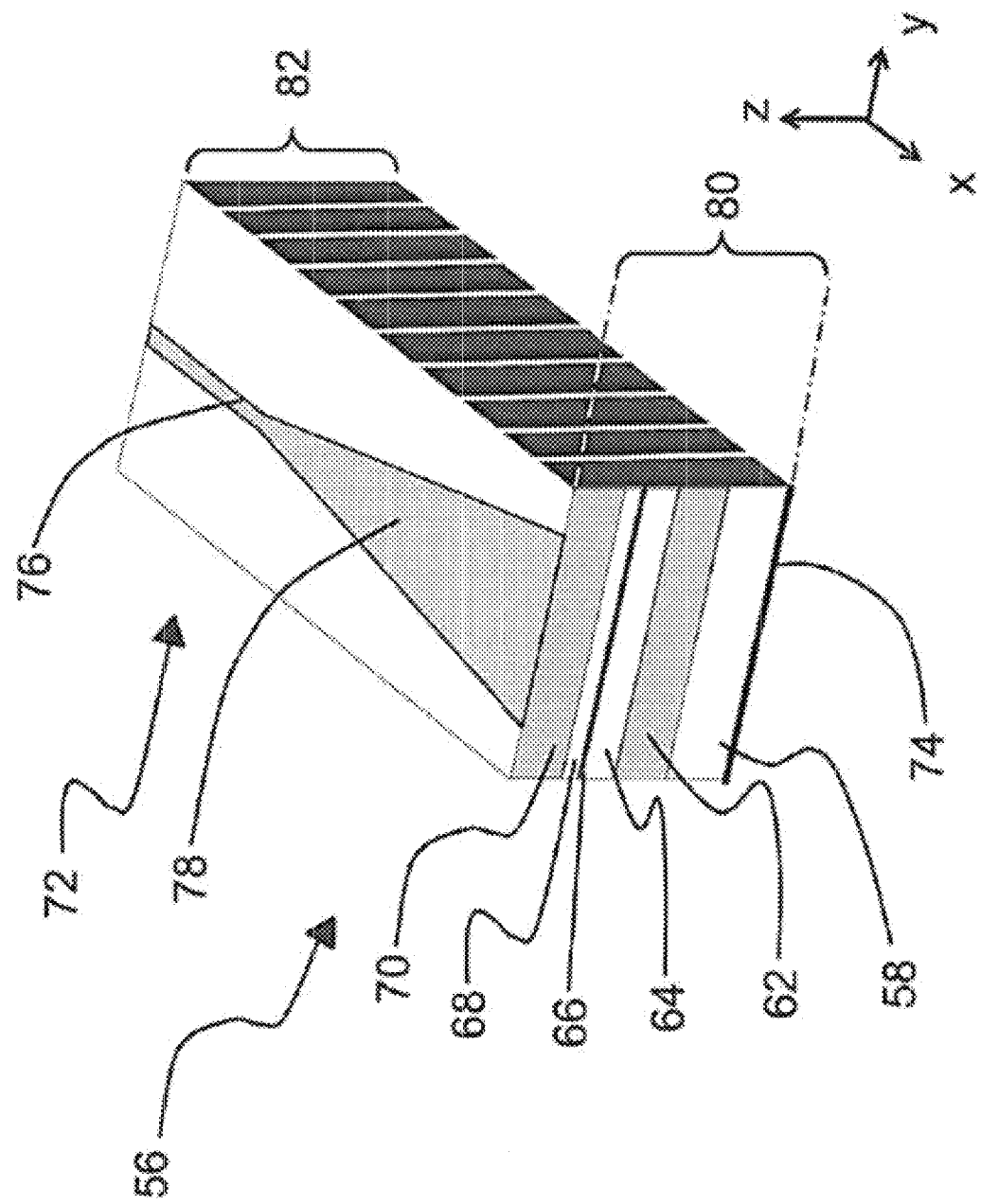
FIG. 1 a conventional trapezoidal laser diode in a schematic perspective representation FIG. 2 a conventional broad-stripe laser in a schematic perspective representation FIG. 3 a laser diode according to the invention in a schematic perspective representation according to a first preferred variant of embodiment FIG. 4 a further preferred exemplary embodiment of the laser diode according to the invention in a schematic perspective representation, FIG. 5 exemplary graphical representation of a dependency of the maximum laser performance P of the width W3 of the resistor elements for a laser diode according to the invention FIG. 6 exemplary graphical representation of the dependency of the maximum laser performance P of the total current I for a laser diode according to the invention with an overlap U of 50% and for a laser diode with an overlap U of 0% (this corresponds to the prior art)
Figure 3:
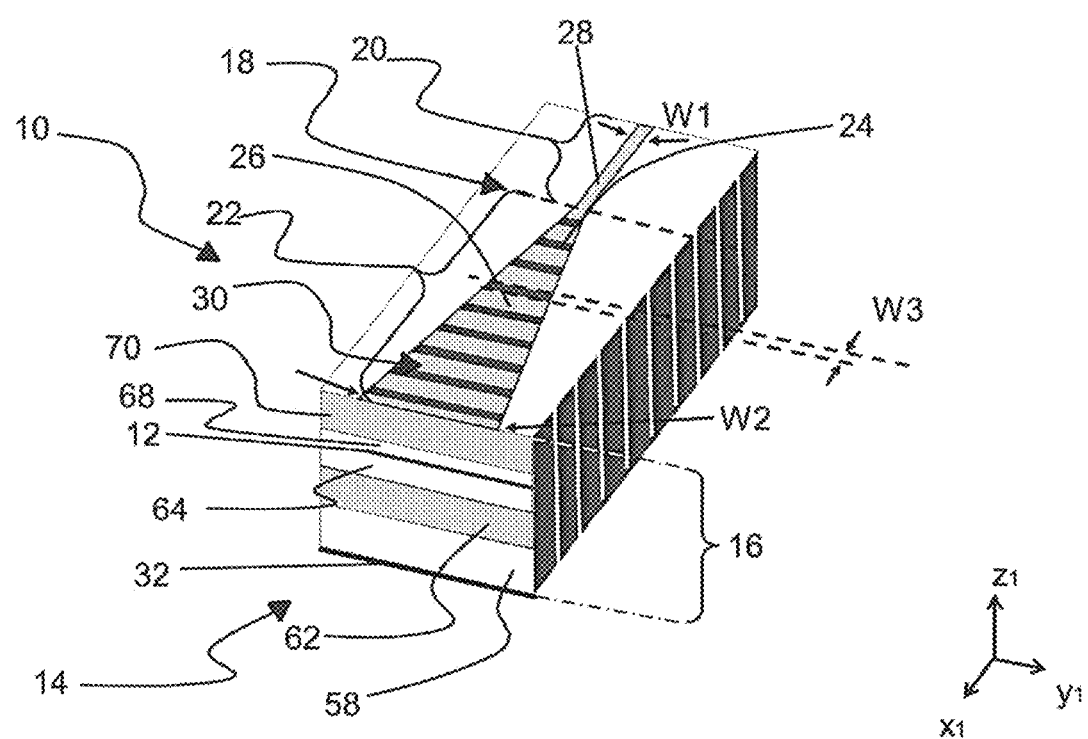

FIG. 3 shows a laser diode 10 according to the invention in accordance with a first preferred variant of embodiment. The reference signs, if they relate to identical features, are identical to those of the prior art described in FIG. 1. The laser diode 10 has an active layer 12 which is arranged within a resonator 14 and is operatively connected to an outcoupling element 16. Furthermore, the laser diode 10 has a first contact layer 18 for coupling charge carriers into the active layer 12 and a second contact layer 32 for coupling out charge carriers from the active layer 12. Further, the laser diode 10 comprises a substrate 58, an n-type cladding layer 62, an n-type waveguide layer 64, a p-type waveguide layer 68 and a p-type cladding layer 70. The respective layer thicknesses and layer materials are shown in Table 1.

TABLE 1

Exemplary layer thicknesses and layer materials

| layer | Thickness of the layer in μm | Material of the layer |
|---|---|---|
| Second contact layer 32 | No information, because substrate | GaAs (substrate) |
| Substrate 58 | ~120 | GaAs |
| N-type cladding layer 62 | ~1 | $Al_{0.85}Ga_{0.15}As$ |
| Active layer 12 | Total: 0.052<br>3 x Quantum wells (0.009)<br>2x Spacers (0.005)<br>2x Barriers (0.0075) | $In_{0.15}Ga_{0.85}As$<br>$GaAs_xP_{1-x}$<br>(x: 0 . . . 0.55) |
| N-type waveguide layer 64 | 3.1 | $Al_{0.20}Ga_{0.80}As$ |
| P-type waveguide layer 68 | 1.7 | $Al_{0.20}Ga_{0.80}As$ |
| P-type cladding layer 70 | ~1 | $Al_{0.85}Ga_{0.15}As$ |
| First contact layer 18 | ~0.1 | GaAs |

The resonator 14 comprises a first section 20 and a second section 22. The first section 20 comprises a rib waveguide region 28 and the second section 22 comprises a trapezoid region 30. The maximum width W1 of the active layer 12 in the first section 20 with 4 μm (Micron) is smaller than the maximum width W2 of the active layer 12 in the second section 22, which is 426 μm. The width of the active layer 12 in the first section 20 is constant and expands uniformly over the second section 22 to the maximum width W2. The length of the first section 20 is 2 mm and the length of the second section 22 is 4 mm. The projection of the contact layer 18 along a first axis Z1 extending perpendicularly to the active layer 12 overlaps both with the first section 20 as well as with the second section 22. The second section 22 also has a plurality of separate resistor elements 24 inserted by implantation, which have a specific resistance of $1\times10^{-1}$ Ω·m and whose specific electrical resistivity is larger by a factor of ~100 than the specific electrical resistivity of the regions 26 between adjacent resistor elements 24. If an exemplary diode laser layer structure is used based on $Al_xGa_{1-x}As$, the overall electrical resistance is at a exemplary broad-stripe laser diode 84 with a resonator length of 3 mm, strip-width of □90 μm and an epitaxial layer thickness of 5 μm at 20 mΩ. The specific electrical resistivity □$\sigma_C$ is approximately $1.0\times10^{-3}$ Ω·m (and thus for example somewhat greater than the specific resistance of a highly doped $Al_{0.85}Ga_{0.15}As$-layer of about $4.2\times10^{-4}$ Ω·m).

The resistor elements 24 are strip-shaped, in other words they each have two plane-parallel surfaces which extend over the entire length of the respective resistor element 24 and whose normal vectors are oriented parallel to a longitudinal axis X1 of the resonator 14. That means the resistor elements 24 are oriented parallel to each other and to the resonator 14. The width W3 of the resistor elements 24 along the longitudinal axis X1 of the active layer 12 is 5 μm at each location of the respective resistor element 24. The width of the resistor elements 24 along their length, or along a lateral axis Y1, is therefore constant. The resistor elements 24 are arranged periodically or equidistantly. The period length is 10 μm. The projection of the resistor elements 24 onto the active layer 12 along the first axis Z1 overlaps with 50% with the active layer. Furthermore, the laser diode 10 is designed to be operated with a DC voltage in the range from 1.2 to 1.6 volts, preferably in the range from 1.4 volts to 1.6 volts.

Figure 4:
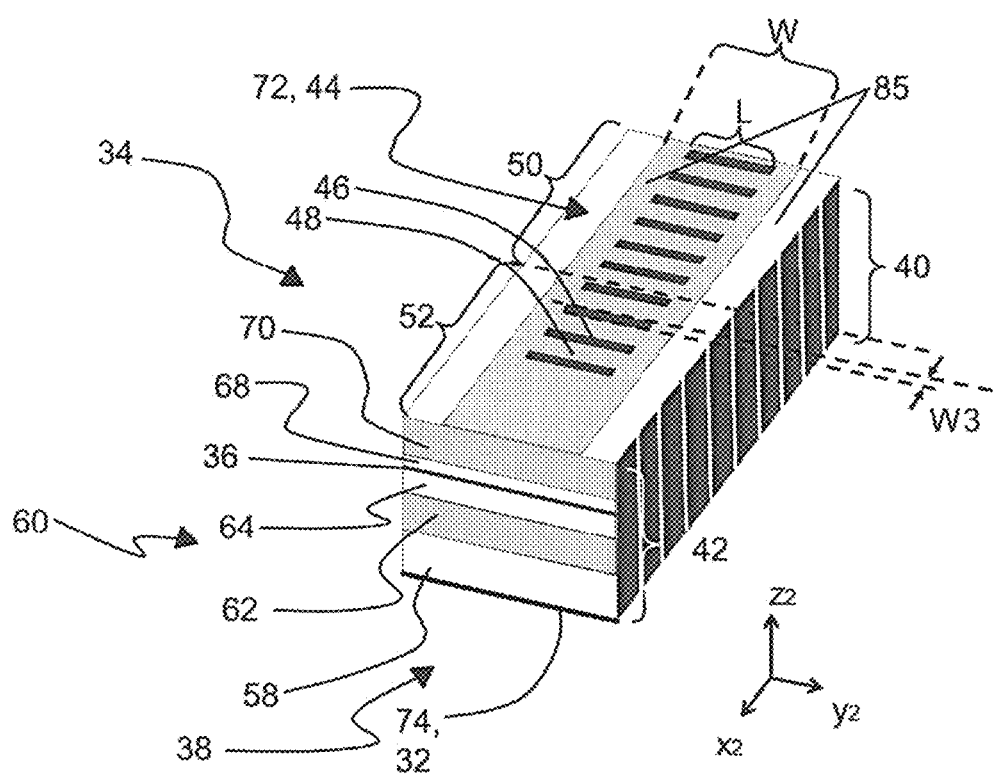

FIG. 4 shows a further preferred exemplary embodiment of a laser diode 34 according to the invention. This is a single-broad-stripe laser diode. The reference signs are, if they relate to identical features, identical to those of the prior art described in FIG. 2, or to those of the laser diode 10 according to the invention described in FIG. 3. Various layers 60 are applied to a substrate 58. These comprise an n-type cladding layer 62, an n-type waveguide layer 64 as well as a p-type waveguide layer 68 and a p-type cladding layer 70. In this embodiment, the laser diode 34 further comprises at least an active layer 36 arranged within a resonator 38 and is operatively connected to a first facet 40 and a second facet 42. The second facet 42 is designed as an outcoupling element. The laser diode 34 further comprises a contact layer 44 functioning as a p-type contact region 72 and designed to supply current to the active layer 36, as well as a contact layer 32 functioning as an n-contact region 74 designed to divert current from the active layer 36. The respective layer thicknesses and layer materials are shown in Table 2.

TABLE 2

Layer thicknesses and layer materials

| Layer | Thickness of the layer in μm | Material of the layer |
|---|---|---|
| Second contact layer 32 | No information, because substrate | GaAs (substrate) |
| Substrate 58 | ~120 | GaAs |
| N-type cladding layer 62 | ~1 | $Al_{0.85}Ga_{0.15}As$ |
| Active layer 12 | Total: 0.052<br>3 x quantum wells (0.009)<br>2x Spacers (0.005)<br>2x Barriers (0.0075) | $In_{0.15}Ga_{0.85}As$<br>$GaAs_xP_{1-x}$<br>(x: 0 . . . 0.55)<br>$GaAs_xP_{1-x}$<br>(x: 0 . . . 0.55) |
| N-type waveguide layer 64 | 3.1 | $Al_{0.20}Ga_{0.80}As$ |
| P-type waveguide layer 68 | 1.7 | $Al_{0.20}Ga_{0.80}As$ |
| P-type cladding layer 70 | ~1 | $Al_{0.85}Ga_{0.15}As$ |
| First contact layer 18 | ~0.1 | GaAs |

Between the first facet 40 and the second facet 42, a plurality of separate resistor elements 46 are arranged periodically (period length 10 μm) or equidistantly, wherein the specific electrical resistivity of the resistor elements 46 is a factor of 100 greater than the specific electrical resistivity of regions 48 between adjacent resistor elements 46. The specific electrical resistivity of the resistor elements 46 is $~1\times10^{-1}$ Ωm. The resistor elements 46 each have two plane-parallel surfaces which extend over the entire length L of the respective resistor element 46 and whose normal vectors are oriented parallel to a longitudinal axis X2 of the active layer 36 or of the resonator 38. That means that the resistor elements 46 are oriented parallel to one another and to the resonator 38. An expansion W3 of the respective resistor elements 46 along the longitudinal axis X2 of the active layer 36 is 5 μm at each location, the width of which is therefore constant. The length L of the resistor elements 46 is 60 μm.

A total surface of the resistor elements 46 in a half 52 of the resonator 38 facing the second facet 42 is approximately 66% of the total surface of the resistor elements 46 in a half 50 of the resonator 38 facing the first facet 40.

Both halves 50, 52 of the resonator 38 extend along the longitudinal axis X2. The width W of the active layer 36 over the total length of the resonator 38 is constant and is 90 μm. In the regions provided with the resistor elements 46, the resistor elements 46 have a uniform distance from one another. Starting from the longitudinal axis X2, the resistor elements 46, extend axis-symmetrically to the longitudinal axis X2 along a lateral axis Y2. The length L of the respective resistor elements 46 is 65% of the width W of the active layer 36 along the lateral axis Y2. The edges 85 therefore have regions without resistor elements 46 which each have an extent along the lateral axis Y2 of 35% of the width W of the active layer 36. The ratio of the width W of the active layer 36 to the length L of the resistor elements 46 laterally to the longitudinal axis of the active layer is 0.7. Furthermore, the laser diode 34 is designed to be operated with a DC voltage in the range from 1.2 to 1.6 volts, preferably in the range from 1.4 volts to 1.6 volts.

Figure 5:
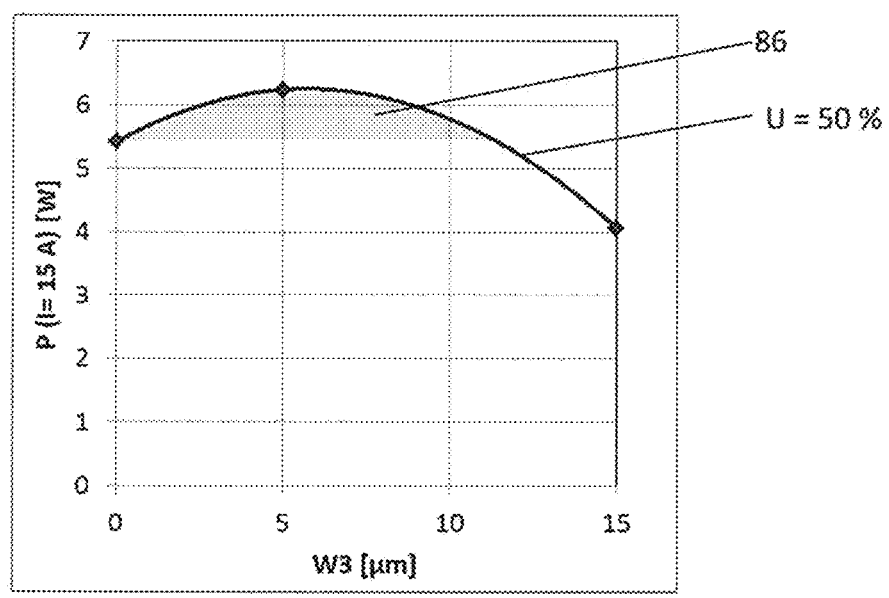
Figure 6:
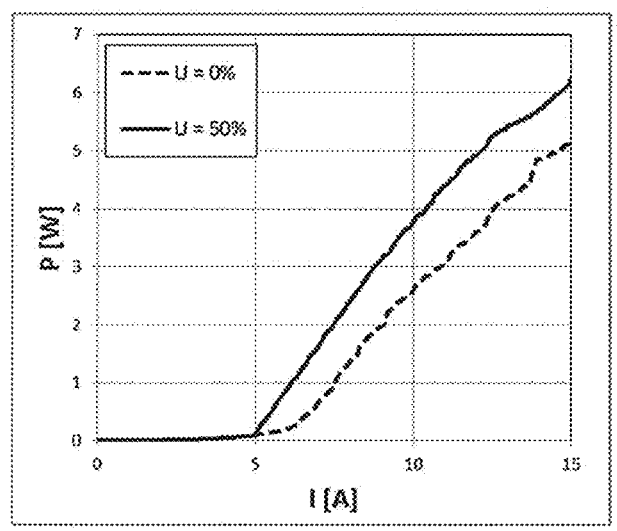

FIGS. 5 and 6 show exemplary evaluations of measurement series which have been carried out for determining optimal design parameters for a laser diode according to the invention. The same reference signs apply as in FIG. 3. In the tests, trapezoidal lasers with resistor elements 24 were made in a trapezoidal region 30. The resistor elements 24 were made with a different width of 5 μm to 15 μm. The projection of the resistor elements 24 on the active layer 12 along the first axis Z1 was made with an overlap of 0%, 30% and 50% with the active layer 12.

An exemplary graphical representation of a dependency of the maximum laser performance P of the width W3 of the resistor elements 24 for a laser diode 10 according to the invention is summarized in FIG. 5 for a constant overlap U (of the projection of the resistor elements 24 on the active layer 12 along an axis Z1, which extends perpendicularly to the active layer 12, 36 with the entire surface of the active layer 12 projected along the same axis Z1). The diagram is based on a laser diode 10 according to the invention, which was operated with a constant current I. In this case, the rib waveguide region 28 and the trapezoidal region 30 were electrically contacted together. Experiments were carried out with three laser diodes 10 according to the invention, wherein the overlapping U was constant at 50% and the width W3 of the resistor elements 24 was varied from 5 μm to 15 μm. An overlap of 0% corresponds to a trapezoidal laser diode according to the prior art as a reference. The tests result in a preferred window for design 86 for the width W3 of the resistor elements 24 in which the maximum laser performance P is above a reference value of the prior art. A preferred range for the width W3 of the resistor elements 24 is 1 μm to 9 μm, even more preferably 3 μm to 7 μm and particularly preferably 4 μm to 6 μm.

An exemplary graphical representation of a dependency of the maximum laser performance P on the overlap U (of the projection of the resistor elements 24 on the active layer 12 along an axis Z1, which extends perpendicularly to the active layer 12 with the entire surface of the active layer 12 projected along the same axis Z1) at constant width W3 of the resistor elements 24 for a laser diode according to the invention is summarized in FIG. 6. The tests were carried out with two laser diodes 10. The width W3 of the resistor elements 24 was constant at 5 μm, and the total current I for supplying the trapezoid (30) and rib waveguide region (28) was varied in order to record characteristic curves of the two laser diodes. Characteristic curves of one laser diode 10 with an overlap U of 0% (this corresponds to the prior art) and 50% are shown. It can be seen that the maximum performance P with increased overlap U also increases. An overlapping U of more than 10%, preferably more than 30% and particularly preferably more than 50% has proven to be advantageous. Advantageous results are obtained up to an overlap U of preferably not more than 95%, particularly preferably not more than 99%.

Figure 7:
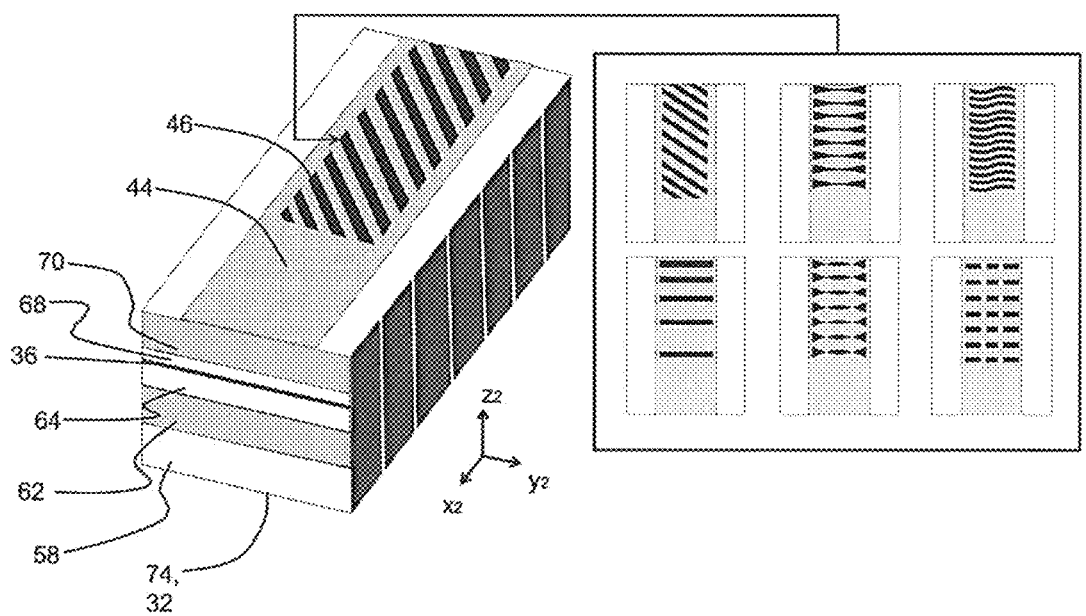
FIG. 7 schematic representation of further preferred embodiments of the resistor elements FIG. 8 exemplary curve of an optical amplification G over a longitudinal cross section of a conventional broad-stripe laser diode FIG. 9 exemplary curve of a temperature T over a lateral cross section of a conventional broad-stripe laser diode

FIG. 7 shows a schematic representation of further preferred embodiments of the resistor elements 24, 46. The representation and the reference signs are leaned on FIG. 4. However, the different shapes of the resistor elements 24, 46 are transferable to laser diodes according to all aspects of the invention.

Figure 2:
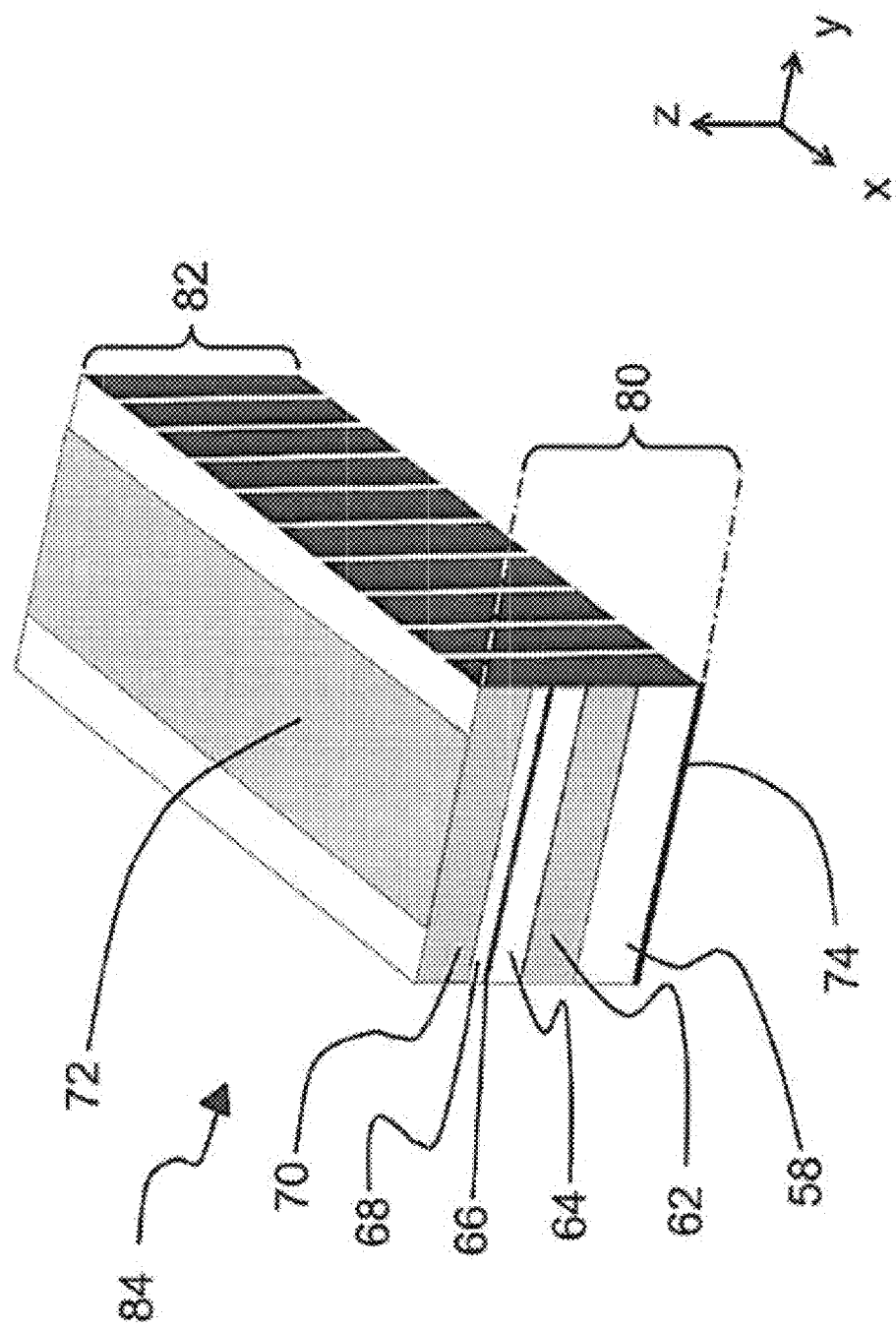
Figure 8:
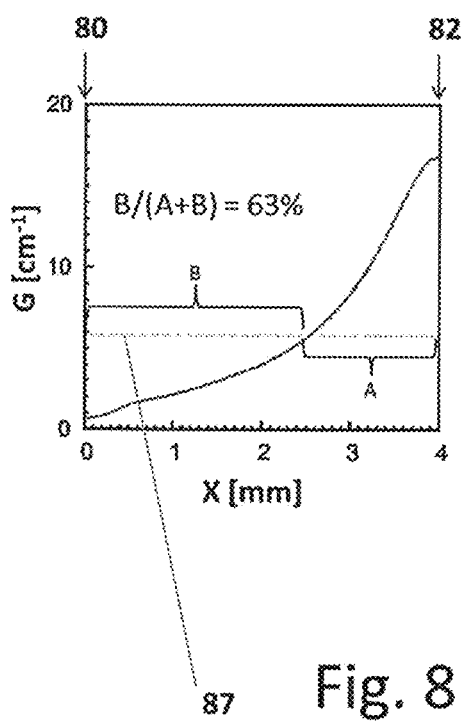

FIG. 8 shows an exemplary curve of an optical amplification or a gain G over a longitudinal cross-section of a conventional broad-stripe laser diode 84 along the X axis (X-axis as shown in FIG. 2). A section plane lies in the X-Z plane and intersects the broad-stripe laser diode 84 centrally. A design rule for further preferred embodiments of laser diodes 34 according to the invention can be derived from the curve of the gain over the X-position (the X zero point lies in the plane of the outcoupling facet 80). It is apparent from the diagram that the optical amplification or the gain G is significantly smaller in a region B, the majority of which faces the front facet 80, than in a region A, the majority of which faces the back facet 82. In this exemplary case, the region B with a smaller gain G extends over approximately 63% of the total length of the resonator, that is, approximately 63% of the length from the front facet 80 to the back facet 82. It is therefore an aim to realize an increase of the current flow in the region B and a reduced current flow through the region A, which in this exemplary case extends over approximately 37% of the length from the back facet 82 to the front facet 80, in order to compensate the difference in the gain G. The resistor elements 46 are therefore to be implanted in the region A. This design rule can be transferred or applied to any curves of an optical amplification by, for example, implanting the resistor elements 46 in the regions in which the current flow is to be reduced. The corresponding design measure advantageously produces an increase of the current flow through the regions in which no resistor elements are implanted and thus advantageously acts against longitudinal hole burning. It has been found that preferred orders of magnitude for region A, in which the resistor elements 46 are inserted, are more than 10%, further preferably more than 30%, further preferably more than 50% and particularly preferably more than 60% of the length of the back facet 82 to the front facet 80. This corresponds to typical gain distributions of known broad-stripe laser diodes 84.

Figure 9:
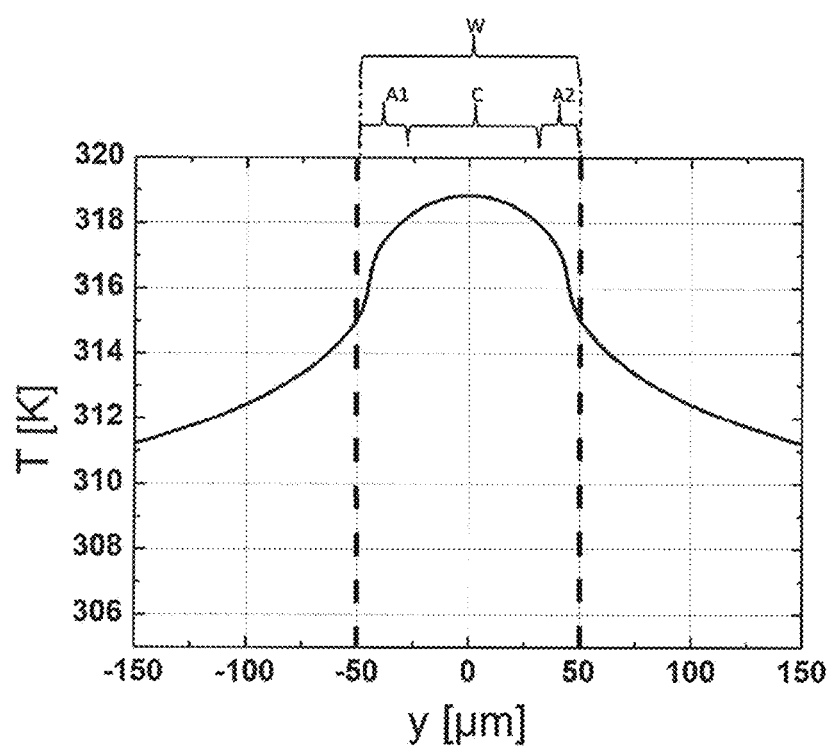

FIG. 9 shows an exemplary curve of a temperature T over a lateral cross-section along the Y-axis (Y-axis as shown in FIG. 2) of a conventional broad-stripe laser diode 84. A section plane lies in the Y-Z plane and intersects the broad-stripe laser diode centrally. A design rule for further preferred embodiments of laser diodes 34 according to the invention can be derived from the curve of the gain via the Y-position (the Y zero point is located centrally in the broad-stripe laser diode 84). A Y-position of 0 mm, which is shown in FIG. 9, corresponds in the Y direction the center point of the laser diode. It can be seen from the diagram that the temperature T in this location and in a center region C is greater than in other regions. Furthermore, FIG. 9 shows that the temperature T in edges A1, A2 of the contact region 72 is less than in the center region C. In this exemplary case, the region C extends in the Y direction over approximately 66% of the width W of the contact region 72. The edges A1, A2 extend in the Y direction in each case approximately 17% of the width W of the contact region 72. It is therefore an aim to realize an increased current flow in the edges A1, A2 and a reduced current flow in the region C. The resistor elements 46 are therefore to be implanted in the region C. This design rule can be transferred or applied to any desired temperature curves by implanting the resistor elements 46 in the regions in which the current flow is to be reduced. The corresponding design measure advantageously produces an increase of the current flow through the regions in which no resistor elements are implanted and thus advantageously counteracts the formation of a thermal lens.

REFERENCE LIST 10 laser diode
12 active layer
14 resonator
16 outcoupling element
18 contact layer
20 first section
22 second section
24 resistor elements
26 regions
28 rib waveguide region
30 trapezoidal region
32 contact layer
34 laser diode
36 active layer
38 resonator
40 first facet
42 second facet
44 contact layer
46 resistor elements
48 regions
50 half
52 half
54 laser
56 trapezoidal laser diode
58 substrate
60 layers
62 n-type cladding layer
64 n-type waveguide layer
66 active zone
68 p-type waveguide layer
70 p-type cladding layer
72 p-doped contact region
74 n-doped contact region
76 rib waveguide region
78 trapezoidal region
80 front facet
82 rear facet
84 broad-stripe laser diode
85 edge
86 window of design
87 ideal uniform longitudinal distribution of the local gain constant.
A region facing back facet
A1 left edge of the contact region
A2 right edge of the contact region
B region facing front facet
C center region of the contact region
G optical amplification (gain)
I current
L length
P maximum laser performance
T temperature
U overlap
W width
W1 maximum width
W2 maximum width
W3 width
X longitudinal axis (longitudinal direction)
X1 longitudinal axis (longitudinal direction)
X2 longitudinal axis (longitudinal direction)
Y lateral axis (lateral direction)
Y1 lateral axis (lateral direction)
Y2 lateral axis (lateral direction)
Z1 first axis (perpendicular direction)
Z2 first axis (perpendicular direction)
Z3 first axis (perpendicular direction)
η conversion efficiency

The invention claimed is:

1. A laser diode comprising:
at least one active layer disposed within a resonator and operatively connected to an outcoupling element, at least one contact layer for coupling charge carriers into the active layer, wherein the resonator comprises at least a first section and a second section, wherein the maximum width of the active layer in the first section differs from the maximum width of the active layer in the second section, and a projection of the contact layer along a first axis extending perpendicular to the active layer, overlaps with the first section as well as with the second section, wherein the second section comprises a plurality of separate resistor elements having a specific electrical resistivity greater than the specific electrical resistivity of the regions between adjacent resistor elements, wherein a width of the resistor elements along a longitudinal axis of the active layer is less than 20 μm, and a projection of the resistor elements on the active layer along the first axis overlaps with at least 10% of the active layer, wherein the resistor elements are, along the longitudinal axis of the active layer, disposed equidistantly to one another and over the entire second section, and wherein each of the resistor elements has a constant extent along the longitudinal axis.

2. The laser diode according to claim 1, wherein a specific electrical resistivity is uniform within the second section over in each case one respective resistor element and over in each case one respective region between two resistor elements along the longitudinal axis of the active layer.

3. The laser diode according to claim 1, wherein a plurality of resistor elements are arranged equidistantly to each other within the second section.

4. The laser diode according to claim 1, wherein all the resistor elements are arranged equidistantly to each other within the second section.

5. The laser diode according to claim 1, wherein the ratio of the specific electrical resistance of the resistor elements to the specific electrical resistance of the regions between adjacent resistor elements is greater than 1000.

6. The laser diode according to claim 1, wherein the first section and the second section are arranged within the resonator between two facets, wherein the ratio of the maximum width of the second section to the maximum width of the first section is greater than 30.

7. The laser diode according to claim 1, wherein the projection of the resistor elements on the active layer along the first axis covers at least 50% of the total surface of the active layer which is projected along the same first axis.

8. The laser diode according to claim 1, wherein the maximum expansion of the respective resistor elements along the longitudinal axis of the active layer is not greater than 11 μm.

9. The laser diode according to claim 1, wherein the resistor elements have at least two plane-parallel surfaces, whose normal vectors are oriented parallel to the longitudinal axis of the active layer.

10. The laser diode according to claim 1, wherein the first section comprises a rib waveguide region and the second section comprises a trapezoidal region.

11. A laser comprising:
at least one laser diode according to claim 1.

12. A laser diode comprising:
at least one active layer arranged within a resonator and operatively connected to a first facet and a second facet, wherein the second facet is designed as an outcoupling element, at least one contact layer for coupling charge carriers into the active layer, a plurality of separate resistor elements, arranged between the first facet and the second facet, wherein the specific electrical resistivity of the resistor elements is greater than the specific electrical resistivity of regions between the adjacent resistor elements, wherein a maximal expansion of the respective resistor elements along a longitudinal axis of the active layer is smaller than 20 μm and wherein a total surface of the resistor elements in a half of the resonator facing the first facet is greater than or equal to the total surface of the resistor elements in a half of the resonator facing the second facet, and wherein each of the resistor elements has an equal extent along a lateral axis extending along a width of the resonator, wherein the resistor elements are, along the longitudinal axis of the active layer, disposed equidistantly to one another and over the entire second section and wherein each of the resistor elements has a constant extent along the longitudinal axis.

13. The laser diode according to claim 12, wherein the resistor elements have at least two plane-parallel surfaces whose normal vectors are oriented parallel to the longitudinal axis of the active layer.

14. The laser diode according to claim 12, wherein the resistor elements extend axially-symmetrically or point-symmetrically to a longitudinal axis of the active layer.

15. The laser diode as claimed in claim 12, characterized in that, the laser diode is designed as a single-broad-stripe laser diode.

16. The laser diode according to claim 12, wherein an extension of the resistor elements along a lateral axis is in a ratio of 0.6 to an extension of the contact layer along the same lateral axis.

17. The laser diode according to claim 12, wherein the resistor elements are arranged over a length of 35% of a path from the first facet to the second facet.

18. The laser diode according to claim 12, wherein the maximum expansion of the resistor elements along the longitudinal axis is 6 μm.

19. A laser comprising:
at least on laser diode according to claim 12.

* * * * *